United States Patent
Makarov et al.

(10) Patent No.: US 9,431,082 B2
(45) Date of Patent: Aug. 30, 2016

(54) MAGNETO-ELECTRONIC COMPONENT, AND METHOD FOR THE PRODUCTION THEREOF

(75) Inventors: Denys Makarov, Dresden (DE); Oliver G. Schmidt, Dresden (DE)

(73) Assignee: LEIBNIZ-INSTITUT FUER FESTKOERPER-UND WERKSTOFFFORSCHUNG DRESDEN E.V., Dresden (DE)

( * ) Notice: Subject to any disclaimer, the term of this patent is extended or adjusted under 35 U.S.C. 154(b) by 304 days.

(21) Appl. No.: 14/004,556

(22) PCT Filed: Mar. 9, 2012

(86) PCT No.: PCT/EP2012/054077
§ 371 (c)(1),
(2), (4) Date: Oct. 17, 2013

(87) PCT Pub. No.: WO2012/123348
PCT Pub. Date: Sep. 20, 2012

(65) Prior Publication Data
US 2014/0030553 A1    Jan. 30, 2014

(30) Foreign Application Priority Data

Mar. 11, 2011    (DE) .................. 10 2011 005 452

(51) Int. Cl.
| | |
|---|---|
| *B32B 15/00* | (2006.01) |
| *G11C 11/14* | (2006.01) |
| *G11C 11/16* | (2006.01) |

(Continued)

(52) U.S. Cl.
CPC .............. *G11C 11/14* (2013.01); *B82Y 40/00* (2013.01); *G11C 11/16* (2013.01); *G11C 19/0841* (2013.01); *H01F 10/3254* (2013.01); *H01F 41/308* (2013.01); *H01L 43/08* (2013.01); *H01L 43/10* (2013.01); *H01L 43/12* (2013.01); *H01F 10/3286* (2013.01); *Y10T 29/49155* (2015.01)

(58) Field of Classification Search
None
See application file for complete search history.

(56) References Cited

U.S. PATENT DOCUMENTS

| | | |
|---|---|---|
| 3,868,659 A | 2/1975 | Schwee |
| 4,231,107 A | 10/1980 | Schwee et al. |

(Continued)

FOREIGN PATENT DOCUMENTS

| | | |
|---|---|---|
| DE | 10 2009 021 400 A1 | 11/2010 |
| GB | 975575 A | 11/1964 |
| KR | 10 2009 0127705 A | 12/2009 |

OTHER PUBLICATIONS

Stuart S.P. Parkin et al., "Magnetic Domain-Wall Racetrack Memory", Science, vol. 320, Apr. 11, 2008, pp. 190-194.

*Primary Examiner* — Holly Rickman
*Assistant Examiner* — Linda Chau
(74) *Attorney, Agent, or Firm* — Greenblum & Bernstein, P.L.C.

(57) ABSTRACT

A magneto-electronic component, having one or more elongate elements of a magnetic material, electrically conductive contacts, at least one insulating thin layer, on which the one or more elongate elements of the magnetic material and the electrically conductive contacts are arranged, and an additional insulating thin layer structured and arranged to cover at least the one or more elongate elements and partially cover the electrically conductive contacts to form an arrangement. At least the one or more elongate elements is connected to the contacts and the contacts are connectable to a current source in an electrically conducting manner. The arrangement is jointly rolled-up to form a rolled-up arrangement having a rolled-up region. At least the electrically conductive contacts are partially located outside the rolled-up region of the rolled-up arrangement.

21 Claims, 2 Drawing Sheets

| (51) | Int. Cl. | |
|---|---|---|
| | G11C 19/08 | (2006.01) |
| | H01L 43/08 | (2006.01) |
| | H01L 43/10 | (2006.01) |
| | H01L 43/12 | (2006.01) |
| | H01F 10/32 | (2006.01) |
| | H01F 41/30 | (2006.01) |
| | B82Y 40/00 | (2011.01) |

(56) References Cited

U.S. PATENT DOCUMENTS

| 7,551,469 | B1 | 6/2009 | Parkin |
|---|---|---|---|
| 7,586,781 | B2 | 9/2009 | Saitoh et al. |
| 7,835,167 | B2 | 11/2010 | Lim et al. |
| 2004/0252539 | A1 | 12/2004 | Parkin |
| 2008/0278998 | A1 | 11/2008 | Cowburn et al. |
| 2010/0085793 | A1 | 4/2010 | Trouilloud |
| 2012/0098534 | A1 | 4/2012 | Hertel et al. |

MAGNETO-ELECTRONIC COMPONENT, AND METHOD FOR THE PRODUCTION THEREOF

CROSS-REFERENCE TO RELATED APPLICATIONS

The present application is a National Stage Application of International Application No. PCT/EP2012/054077 filed Mar. 9, 2012, which published as WO 2012/123348 A2 on Sep. 20, 2012, the disclosures of which are expressly incorporated by reference herein in their entireties. Further, the present application claims priority under 35 U.S.C. §119 and §365 of German Application No. 10 2011 005 452.9, filed Mar. 11, 2011.

BACKGROUND OF THE INVENTION

1. Field of the Invention

The invention relates to the fields of physics and materials science, and relates to a magneto-electronic component as it can be used, for example, as a digital memory, and to a method for the production thereof.

2. Discussion of Background Information

Magnetic shift registers, also referred to as "racetrack memory devices," are magnetic memories that combine the sturdiness of flash memories, the speed of DRAM memories and the reversibility and non-liquidity of hard drives with one another. Racetrack memories of this type have been scientifically studied by and are known from S. S. P. Parkin, M. Hayashi, L. Thomas, "Magnetic Domain-Wall Racetrack Memory," Science 320, 190-194 (2008). Elongate ferromagnetic memory structures are divided into magnetic domains with differing orientation of the magnetic moment. These magnetic domains are separated by domain walls, which can be moved in the data medium. An effect is thereby utilized which is known as the spin transfer torque effect, and results in magnetic domain walls being able to be moved in thin memory structures in a controlled manner along these memory structures by the application of electric currents. Digital data are coded into the interval between two consecutive domain walls. Racetrack memories of this type can be constructed in a two-dimensional alignment—horizontal nanowires on a substrate—or in a three-dimensional alignment—U-shaped, vertical nanowires that are connected to a substrate and/or to electrodes in the lower U-region—(S. S. P. Parkin et al., Science 320, 190-194 (2008)).

A basic requirement for the functioning of racetrack memories is the quick and controlled movement of domain walls along thin magnetic strips. Here, it is particularly important that the rate of the movement of the domain walls is as high as possible. For this purpose, a magneto-electronic component is known according to DE 10 2009 021 400 A1 which consists of an elongate ferromagnetic material, along which magnetic domain walls move, wherein the transversal magnetization direction of the domain walls at their center has no direction of preference on the plane perpendicular to their direction of movement along the elongate ferromagnetic material.

Likewise, known are magnetic racetrack memories that consist of an elongate magnetic material, a current source, a writing device and reading device, and a write-back loop, wherein the elongate magnetic material has a plurality of magnetic domains (KR 10 2009 0127705 A).

Furthermore, an elongate material is known from US 2010/0085793 A1 in which at least two regions with a plurality of magnetic domains are present, which regions are separated from one another by a non-magnetic material and which prevent a movement of the domain walls from one region to the other. When an electric current is applied, the regions in which data are stored move in a direction of the current flow.

From U.S. Pat. No. 7,551,469 B1, a unidirectional racetrack memory is known. In this memory, the domain walls move in only one direction along the direction of current flow. The writing element can hereby be arranged at one end of the elongate memory and the reading element at the other end.

Disadvantageous in the case of the known solutions for racetrack memories is the practical implementation, in particular for three-dimensional solutions. The arrangement of individual horizontal nanowires on a substrate is technically achievable. However, precisely the special advantage of such a memory, the high storage density, cannot be achieved by such an arrangement. The arrangement suggested by the prior art for three-dimensional solutions for racetrack memories in the form of U-shaped nanowires, which in the lower region of the U are provided with electric contacts and are possibly arranged on a substrate, is also already not technically feasible because the plurality of such U-shaped nanowires must not come into contact with one another, and furthermore, because each nanowire must be individually connected to an electric current source. Accordingly, there are currently no other suggestions for three-dimensional racetrack memories aside from this suggestion by S. S. P. Parkin, and above all, no technical solution.

SUMMARY OF EMBODIMENTS OF THE INVENTION

An aim of the invention consists in the disclosure of a magneto-electronic component that can be used as a racetrack memory and which, embodied three-dimensionally, has a high storage density per unit of volume, and a method for the production thereof which is simple and cost-effective.

The aim is attained by the invention disclosed in the independent claims. Advantageous embodiments are the subject matter of the dependent claims.

The magneto-electronic component according to the invention consists of at least one insulating thin layer, on which at least one elongate element of a magnetic material and electrically conductive contacts are located, wherein at least the elongate element is connected to the contacts and these contacts to a source of current in an electrically conducting manner, and of an additional insulating thin layer, which covers at least the elongate element and partially covers the electrically conductive contacts, and this arrangement (without the current source) is jointly rolled-up, wherein at least the electrically conductive contacts are partially located outside the rolled-up region of the arrangement.

Advantageously, the elongate element is made of a soft magnetic or hard magnetic material, more advantageously of a ferromagnetic or ferrimagnetic material, such as for example of Ni—Fe alloys or Co—Fe alloys, or Co/Pt(Pd) or of Tb—Fe—Co-based or Gd—Fe—Co-based alloys.

Likewise advantageously, the elongate element has the shape of a wire or a tube with dimensions of width and height in the micrometer range to nanometer range and with dimensions of length in the centimeter range to nanometer range.

Also advantageously, the insulating thin layer is magnetically and electrically insulating and is advantageously made of Cr/Ta Ti/Ta or Cr or Ti, or is combined with non-conducting layers, such as Al—O or Si—O or Si—N or Mg—O.

Likewise advantageously, the magneto-electric component is arranged on a substrate, which is advantageously made of glass, Si—O or $Al_2O_3$ or MgO or Cu or Si.

And, also advantageously, the rolled-up layers have a thickness of 10 nm to 200 nm and lengths of 0.2 µm to 5 mm.

It is also advantageous if several insulating thin layers and several elongate elements of a magnetic material have, jointly rolled-up, a thickness of 10 nm to 100 µm and lengths of 0.2 µm to 5 mm.

Furthermore, it is advantageous if the rolled-up arrangement has one complete winding to 20 windings.

It is likewise advantageous if many rolled-up arrangements are located on a substrate, which arrangements are arranged next to one another and/or on top of one another, wherein one or several of the rolled-up arrangements has respectively a different or equal number of thin layers and/or elongate elements.

It is also advantageous if the rolled-up thin layers contain additional functional layers and supporting layers, whereby insulator layers, roll-support layers, covering layers are more advantageously present as additional functional layers and supporting layers.

In the method according to the invention for producing a magneto-electronic component, at least one elongate element of a magnetic material is applied to an insulating thin layer, electric contacts are also applied, wherein at least the elongate element is connected to electric contacts, which in turn are connected to a current source, and an additional insulating thin layer is applied thereto, which additional layer covers at least the one elongate element and only partially covers the electric contacts, wherein the layer stack is arranged such that it has a strain gradient which leads to the automatic rolling-up of the layer stack, wherein the rolling-up is only achieved to the extent that the electric contacts are at least partially accessible outside the rolled-up arrangement following the rolling-up.

Advantageously, the bottom insulating thin layer is arranged on a substrate.

Likewise advantageously, a sacrificial layer is arranged between a substrate and the bottom insulating thin layer, which relieves a strain gradient in the layer stack which leads to the automatic rolling-up of the layer stack after the sacrificial layer has been at least partially removed. More advantageously, the sacrificial layer is completely removed.

Also advantageously, a multiple layer construction is achieved, wherein one insulating thin layer is always applied below and above the at least one elongate element.

With the solution according to embodiments of the invention, it becomes possible at first to achieve a magneto-electronic component that can be used as a racetrack memory, that is embodied three-dimensionally and has a high storage density per unit of volume. Furthermore, it can be produced in a simple and cost-effective manner.

With the solution according to embodiments of the invention, it is henceforth possible to produce, instead of the known memories which are arranged two-dimensionally on a substrate, a rolled-up layer system that now can contain a plurality of memory elements instead of a single nanowire according to the prior art. The magneto-electric component according to the invention can thereby contain one or several elongate elements of a magnetic material inside a rolled-up layer system, but multiple components according to embodiments of the invention can also be arranged next to one another and/or on top of one another and be electrically connected to one another. By the solution according to embodiments of the invention, a compact arrangement can be achieved that leads to the high storage density per unit of volume. At the same time, the magneto-electronic component according to embodiments of the invention is producible in a considerably simpler and more cost-effective manner.

The magneto-electronic component according to the invention thereby consists of at least one insulating thin layer. This insulating thin layer is electrically and magnetically insulating, and also suitably adhesive in the case of the presence of a substrate. The insulating thin layer can also be arranged on a substrate as a bottom layer. At least one elongate element of magnetic material is applied to this bottom insulating thin layer. This elongate element can be present in the shape of a wire or a tube with dimensions in width and height in the micrometer range to nanometer range and with dimensions in length in the centimeter range to nanometer range. The cross section of the elongate element can thereby be embodied following all known shapes for elongate elements, such as round, triangular, quadrangular to polygonal, ellipsoidal, or not following any geometric shape. The shape of the cross section can vary over the length of the elongate element. This elongate element or multiple elongate elements are advantageously made of a soft magnetic or hard magnetic material, and in particular, made of a ferromagnetic or ferrimagnetic material. The multiple elongate elements are arranged on the bottom insulating thin layer transversally or at an angle between 0° and 90° to the roll-up direction, advantageously transversally, that is, at an angle of 90°, and provided at least with electric contacts for the feed and discharge of electric current and for the writing and reading of data. These electrically conductive contacts are located on the bottom insulating layer. This entire arrangement is then covered by an additional insulating thin layer. It covers at least one elongate element and only partially covers the electrically conductive contacts, wherein the uncovered contacts constitute the electrical connections of the entire component, which connections are further led to a current source. The layer stack of the at least two insulating thin layers and the at least one elongate element is applied, such that a mechanical strain gradient is produced in the layer stack. The mechanical strain is relaxed by the separation of the layer stack and leads to the thin layer arrangement rolling itself up.

After the rolling-up of the arrangement, at least the electrically conductive contacts are located partially outside the rolled-up region. In the case of embodiments of the invention in which several thin layers and/or several elongate elements are applied, a part must also always be accessible for the electrical contacting.

Several components according to embodiments of the invention can be produced simultaneously by several layers being arranged on a substrate that are respectively rolled-up. The rolled-up layers can be removed from the substrate and transferred to other substrates, or remain on the substrate, so that additional components also of a different type can be added and integrated.

The magneto-electronic components according to embodiments of the invention can be interconnected individually or in a plurality and be used as racetrack memory elements.

Aspects of embodiments of the invention are directed to a magneto-electronic component, comprising one or more elongate elements of a magnetic material, electrically conductive contacts, at least one insulating thin layer, on which the one or more elongate elements of the magnetic material and the electrically conductive contacts are arranged, and an additional insulating thin layer structured and arranged to cover at least the one or more elongate elements and partially cover the electrically conductive contacts to form an arrangement. At least the one or more elongate elements is connected to the contacts and the contacts are connectable to a current source in an electrically conducting manner. The arrangement is jointly rolled-up to form a rolled-up arrangement having a rolled-up region. At least the electrically conductive contacts are partially located outside the rolled-up region of the rolled-up arrangement.

In embodiments of the invention, the one or more elongate elements comprises one of a soft magnetic material and a hard magnetic material.

In further embodiments of the invention, wherein the one or more elongate elements comprises one of a ferromagnetic and ferrimagnetic material.

In additional embodiments of the invention, the one or more elongate elements comprises one of Ni—Fe alloys, Co—Fe alloys, Co/Pt(Pd), Tb—Fe—Co-based alloys and Gd—Fe—Co-based alloys.

In yet further embodiments of the invention, the one or more elongate elements has a wire shape or a tube shape having dimensions of width and height in a micrometer range to nanometer range and having dimensions of length in a centimeter range to nanometer range.

In embodiments of the invention, the at least one insulating thin layer is magnetically and electrically insulating.

In further embodiments of the invention, the at least one insulating thin layer comprises Cr/Ta, Ti/Ta, Cr or Ti, or is combined with non-conducting layers.

In additional embodiments of the invention, wherein the non-conducting layers comprise one of Al—O, Si—O, Si—N, and Mg—O.

In yet further embodiments of the invention, the magneto-electric component is arranged on a substrate.

In embodiments of the invention, the substrate comprises one of glass, Si—O, $Al_2O_3$, MgO, Cu, and Si.

In further embodiments of the invention, the rolled-up region has a thickness of 10 nm to 200 nm and lengths of 0.2 µm to 5 mm.

In additional embodiments of the invention, a plurality of insulating thin layers and a plurality of elongate elements of magnetic material jointly rolled-up, in the rolled-up region have a thickness of 10 nm to 100 µm and a length of 0.2 µm to 5 mm.

In yet further embodiments of the invention, the rolled-up arrangement has one complete winding to 20 windings.

In embodiments of the invention, a plurality of rolled-up arrangements located on a substrate, which rolled-up arrangements are arranged next to one another and on top of one another, wherein at least one of the rolled-up arrangements has respectively a different or equal number of thin layers and/or elongate elements.

In further embodiments of the invention, the rolled-up arrangement contains additional functional layers and supporting layers.

In additional embodiments of the invention, the additional functional layers and supporting layers comprise at least one of insulator layers, roll-support layers, and covering layers.

Further aspects of embodiments of the invention are directed to a method for producing a magneto-electronic component, The method comprises forming a layer stack, comprising: applying one or more elongate elements of a magnetic material to an insulating thin layer, applying electric contacts to the insulating thin layer, wherein at least one or more elongate elements are connected to electric contacts, which in turn are connectable to a current source, and applying an additional insulating thin layer to the insulating thin layer, which additional insulating thin layer covers at least the one or more elongate elements and only partially covers the electric contacts. The layer stack is arranged such that the layer stack has a strain gradient which leads to an automatic rolling-up of the layer stack to form a rolled-up arrangement. The rolling-up is only to an extent that the electric contacts are at least partially accessible outside the rolled-up arrangement following the rolling-up.

In embodiments of the invention, the insulating thin layer is arranged on a substrate.

In further embodiments of the invention, the method further comprises arranging a sacrificial layer between a substrate and the insulating thin layer; and at least partially removing the sacrificial layer, which relieves the strain gradient in the layer stack and brings about the automatic rolling-up of the layer stack.

In additional embodiments of the invention, the sacrificial layer is completely removed.

In yet further embodiments of the invention, the method comprises forming a multiple layer construction, in which one insulating thin layer or additional insulating thin layer is applied below and above the one or more elongate elements.

BRIEF DESCRIPTION OF THE DRAWINGS

The invention is explained below in greater detail with the aid of several exemplary embodiments.

It is thereby shown.

DETAILED DESCRIPTION OF EMBODIMENTS OF THE INVENTION

Example 1

Figure 1:
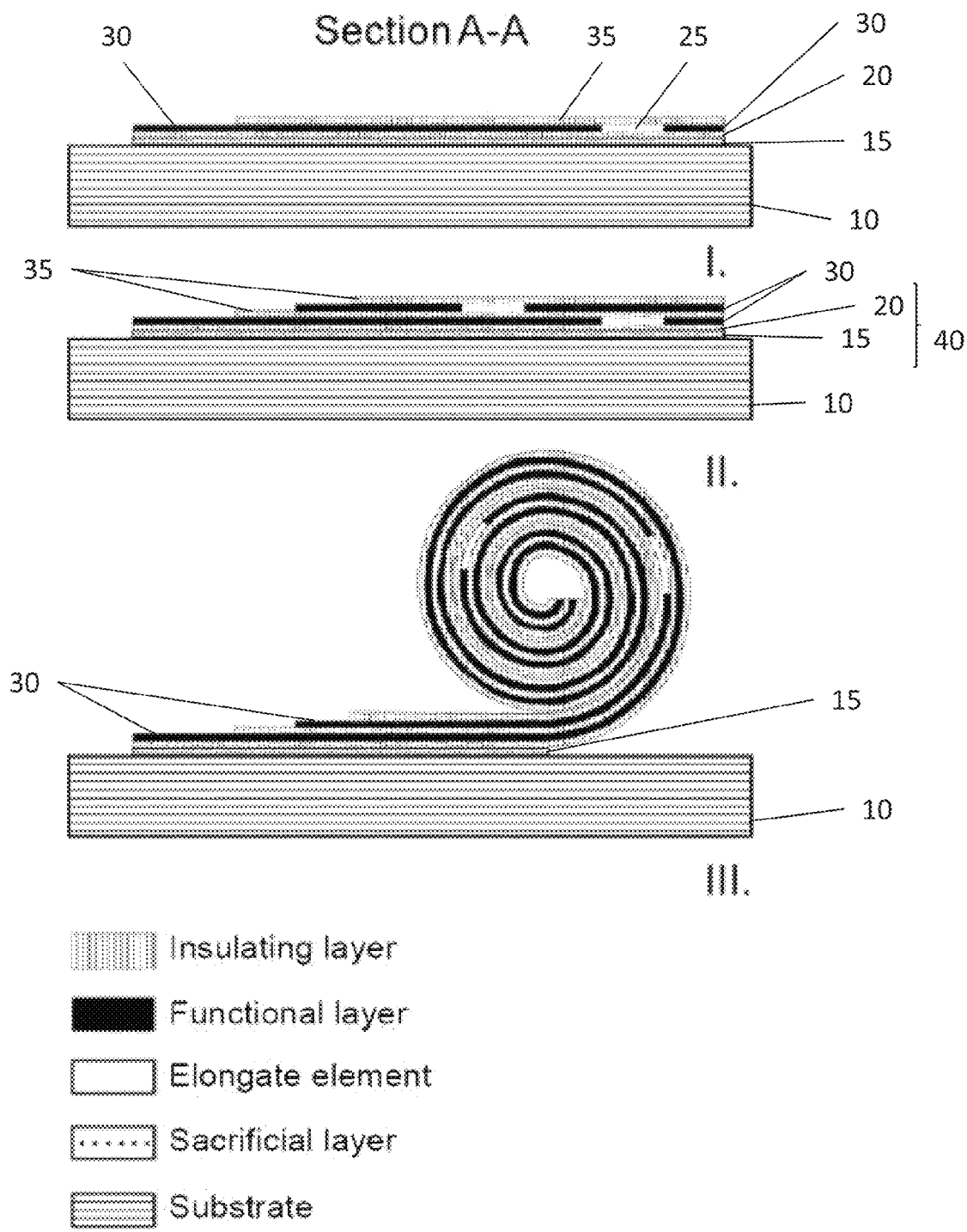
FIG. 1 A rolled-up component according to embodiments of the invention in cross section with one and several functional layers and the elongate element before and after the rolling-up, and FIG. 2 A schematic representation of the component according to embodiments of the invention with two or several elongate elements.

To a glass substrate 10 with the dimensions 76 mm×76 mm and a thickness of 0.5 mm, a sacrificial layer 15 of a photoresist with the dimensions of 500 µm length (in the direction of roll), 100 µm width, and 10 nm thickness, and subsequently an insulating thin layer 20 of Al—O with the dimensions of 500 µm length (in a direction of roll), 100 µm width, and 10 nm thickness is applied. To this thin layer 20, a wire of Ni—Fe alloy with the dimensions of 60 µm length, 100 nm width, and 20 nm height is applied as an elongate element 25 to the thin layer 20 such that the elongate element 25 is arranged with its length transversally, that is, at an angle of 90°, to the direction of roll (FIG. 1 with n=1). Six electrically conductive contacts 30 of Cu are subsequently applied, wherein all are arranged connected to the elongate element 25 in an electrically conducting manner (see FIG. 2). Once the electrically conductive contacts 30 are applied, an additional thin layer 35 of Al—O with the same dimensions as the bottom layer is applied on top of the elongate element 25 and the electrically conductive contacts 30. The electrically conductive contacts 30 on the side facing away from the elongate element 25 thereby extend to outside the top and bottom Al—O layer. The layer stack 40 is subsequently dipped in acetone and rolled up.

Example 2

Figure 2:
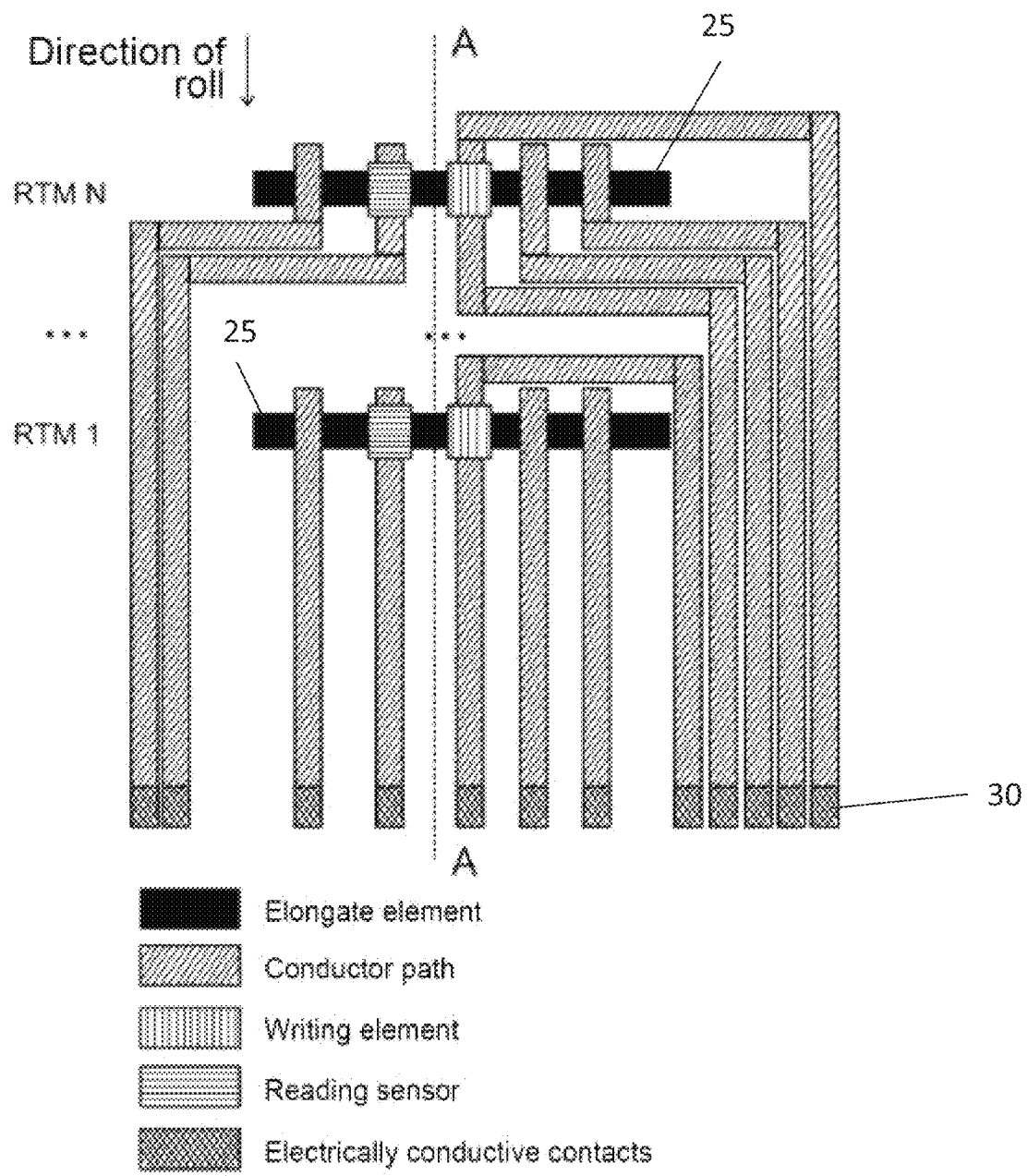

To a glass substrate 10 with the dimensions 76 mm×76 mm and a thickness of 0.5 mm, a sacrificial layer 15 of a photoresist with the dimensions of 500 µm length (in the direction of roll), 100 µm width, and 10 nm thickness is applied. An insulating thin layer 20 of Al—O with the same dimensions is applied to this sacrificial layer 15. To this thin layer 20, two elongate elements 25 in the shape of a nanowire of Ni—Fe alloy with respectively the dimensions of 60 µm length, 100 nm width, and 20 nm height are applied to the thin layer 20 such that the wires are arranged with their lengths at an angle of 90° to the direction of roll (FIG. 2 with n=2). Twelve electrically conductive contacts 30 (and conductive paths) of Cu are subsequently applied, wherein six are respectively arranged connected to one elongate element 25 each in an electrically conducting manner (via the conductive paths). Once the electrically conductive contacts 30 (and conductive paths) are applied, an additional thin layer 35 of Al—O with the same dimensions as the bottom layer is applied on top of the elongate elements 25 and the electrically conductive contacts 30 (and conductive paths). The electrically conductive contacts 30 on the side facing away from the elongate elements 25 thereby extend to outside the top and bottom Al—O layer (or additional thin layer 35 and thin layer 20, respectively). The layer stack is subsequently dipped in an etching solution, the sacrificial layer 15 is removed, and the arrangement is rolled up.

The invention claimed is:

1. A magneto-electronic component, comprising:
one or more elongate elements of a magnetic material;
electrically conductive contacts;
at least one insulating thin layer, on which the one or more elongate elements of the magnetic material and the electrically conductive contacts are arranged; and
an additional insulating thin layer structured and arranged to cover at least the one or more elongate elements and partially cover the electrically conductive contacts to form an arrangement,
wherein at least the one or more elongate elements is connected to the contacts and the contacts are connectable to a current source in an electrically conducting manner,
wherein the arrangement is jointly rolled-up to form a rolled-up arrangement having a rolled-up region, and
wherein at least the electrically conductive contacts are partially located outside the rolled-up region of the rolled-up arrangement.

2. The magneto-electric component according to claim 1, wherein the one or more elongate elements comprises one of a soft magnetic material and a hard magnetic material.

3. The magneto-electric component according to claim 2, wherein the one or more elongate elements comprises one of a ferromagnetic and ferrimagnetic material.

4. The magneto-electric component according to claim 2, wherein the one or more elongate elements comprises one of Ni—Fe alloys, Co—Fe alloys, Co/Pt(Pd), Tb—Fe—Co-based alloys and Gd—Fe—Co-based alloys.

5. The magneto-electric component according to claim 1, wherein the one or more elongate elements has a wire shape or a tube shape having dimensions of width and height in a micrometer range to nanometer range and having dimensions of length in a centimeter range to nanometer range.

6. The magneto-electric component according to claim 1, wherein the at least one insulating thin layer is magnetically and electrically insulating.

7. The magneto-electric component according to claim 1, wherein the at least one insulating thin layer comprises Cr/Ta, Ti/Ta, Cr or Ti, or is combined with non-conducting layers.

8. The magneto-electric component according to claim 7, wherein the non-conducting layers comprise one of Al—O, Si—O, Si—N, and Mg—O.

9. The magneto-electric component according to claim 1, wherein the magneto-electric component is arranged on a substrate.

10. The magneto-electric component according to claim 9, wherein, the substrate comprises one of glass, Si—O, $Al_2O_3$, MgO, Cu, and Si.

11. The magneto-electric component according to claim 1, wherein the rolled-up region has a thickness of 10 nm to 200 nm and lengths of 0.2 µm to 5 mm.

12. The magneto-electric component according to claim 1, wherein a plurality of insulating thin layers and a plurality of elongate elements of magnetic material jointly rolled-up, in the rolled-up region have a thickness of 10 nm to 100 µm and a length of 0.2 µm to 5 mm.

13. The magneto-electric component according to claim 1, wherein the rolled-up arrangement has one complete winding to 20 windings.

14. The magneto-electric component according to claim 1, comprising a plurality of rolled-up arrangements located on a substrate, which rolled-up arrangements are arranged next to one another and on top of one another, wherein at least one of the rolled-up arrangements has respectively a different or equal number of thin layers and/or elongate elements.

15. The magneto-electric component according to claim 1, wherein the rolled-up arrangement contains additional functional layers and supporting layers.

16. The magneto-electric component according to claim 15, wherein the additional functional layers and supporting layers comprise at least one of insulator layers, roll-support layers, and covering layers.

17. A method for producing a magneto-electronic component, comprising:
forming a layer stack, comprising:
applying one or more elongate elements of a magnetic material to an insulating thin layer,
applying electric contacts to the insulating thin layer, wherein at least one or more elongate elements are connected to electric contacts, which in turn are connectable to a current source, and
applying an additional insulating thin layer to the insulating thin layer, which additional insulating thin layer covers at least the one or more elongate elements and only partially covers the electric contacts,
wherein the layer stack is arranged such that the layer stack has a strain gradient which leads to an automatic rolling-up of the layer stack to form a rolled-up arrangement, and
wherein the rolling-up is only to an extent that the electric contacts are at least partially accessible outside the rolled-up arrangement following the rolling-up.

18. The method according to claim 17, wherein the insulating thin layer is arranged on a substrate.

19. The method according to claim 17, further comprising:
arranging a sacrificial layer between a substrate and the insulating thin layer; and at least partially removing the sacrificial layer, which relieves the strain gradient in the layer stack and brings about the automatic rolling-up of the layer stack.

20. The method according to claim 19, wherein the sacrificial layer is completely removed.

21. The method according to claim 17, comprising forming a multiple layer construction, in which one insulating thin layer or additional insulating thin layer is applied below and above the one or more elongate elements.

* * * * *